United States Patent [19]
Ota et al.

[11] Patent Number: 5,949,113
[45] Date of Patent: Sep. 7, 1999

[54] STATIC RAM HAVING A STABLE HIGH-RESISTANCE LOAD

[75] Inventors: Noriyuki Ota; Shingo Hashimoto; Hitoshi Mitani, all of Tokyo, Japan

[73] Assignee: NEC Corporation, Tokyo, Japan

[21] Appl. No.: 09/025,154

[22] Filed: Feb. 18, 1998

[30] Foreign Application Priority Data

Feb. 21, 1997 [JP] Japan ..................................... 9-054049

[51] Int. Cl.⁶ .......................... H01L 29/76; H01L 29/00; H01L 27/11
[52] U.S. Cl. ......................... 257/380; 257/380; 257/382; 257/538; 257/904
[58] Field of Search .................................. 257/379–382, 257/384, 538, 903, 904, 393, 385, 536, 537; 438/210, 238, 382, 384, 385, 596

[56] References Cited

U.S. PATENT DOCUMENTS

| | | | |
|---|---|---|---|
| 4,785,342 | 11/1988 | Yamanaka et al. | 257/379 |
| 5,349,206 | 9/1994 | Kimura | 257/67 |
| 5,508,540 | 4/1996 | Ikeda et al. | 257/298 |
| 5,661,325 | 8/1997 | Hayashi et al. | 257/393 |

FOREIGN PATENT DOCUMENTS

| | | |
|---|---|---|
| 3-157966 | 7/1991 | Japan . |
| 3-157969 | 7/1991 | Japan . |
| 4-17366 | 1/1992 | Japan . |
| 6-132498 | 5/1994 | Japan . |

*Primary Examiner*—Tom Thomas
*Assistant Examiner*—Ori Nadav
*Attorney, Agent, or Firm*—Young & Thompson

[57] ABSTRACT

A static RAM has a low resistive contact film disposed in direct contact with a storage node of a memory cell and the gate electrode of a driver transistor in a through-hole, and in direct contact with an end portion of a high-resistance load. An accurate and stable resistance can be obtained for the high-resistance load without raising the contact resistance between the storage node and the gate electrode of the driver transistor.

8 Claims, 13 Drawing Sheets

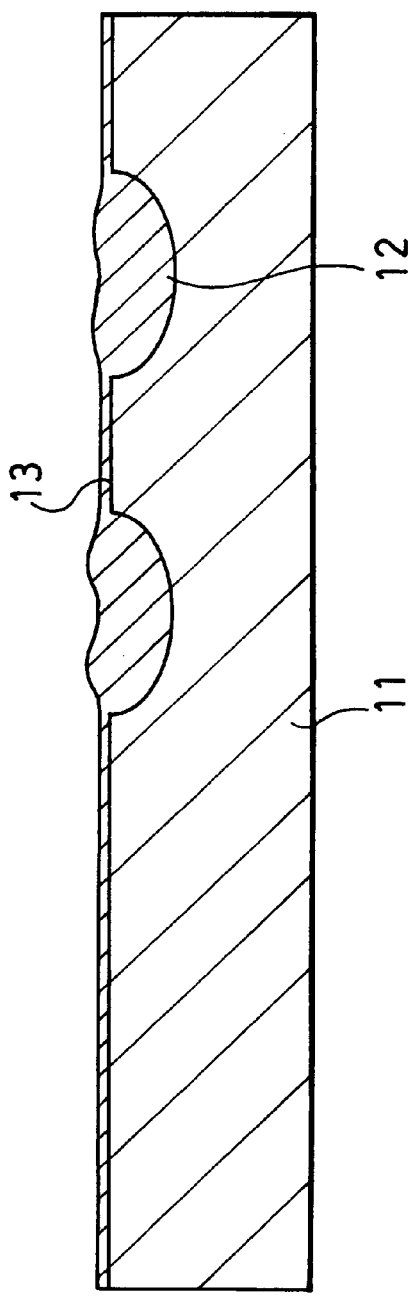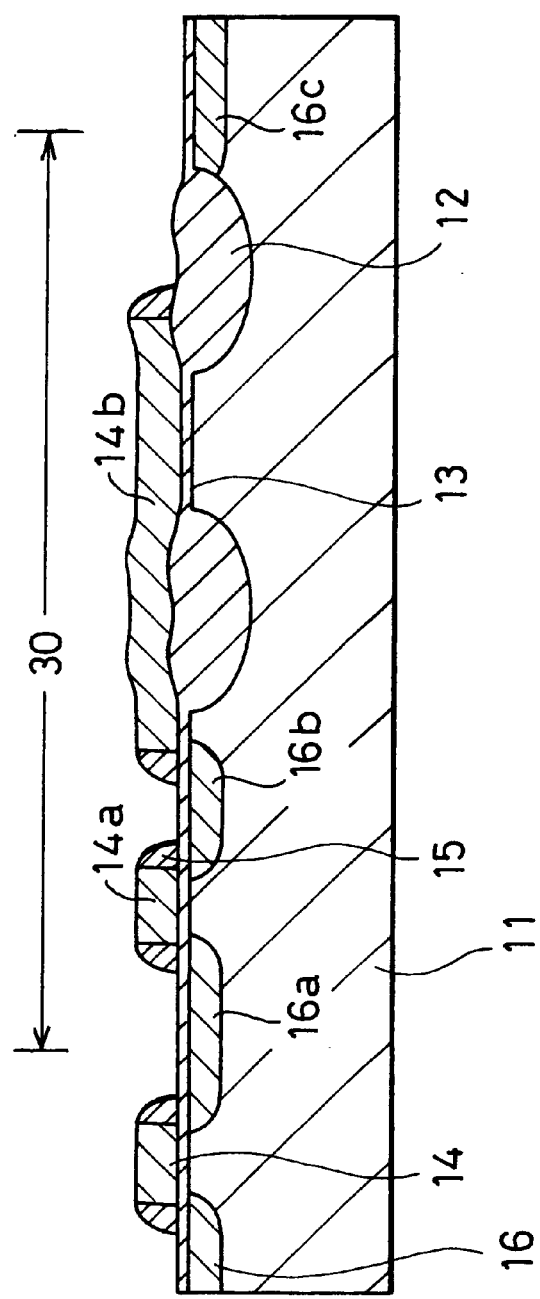
FIG. 3A
FIG. 3B

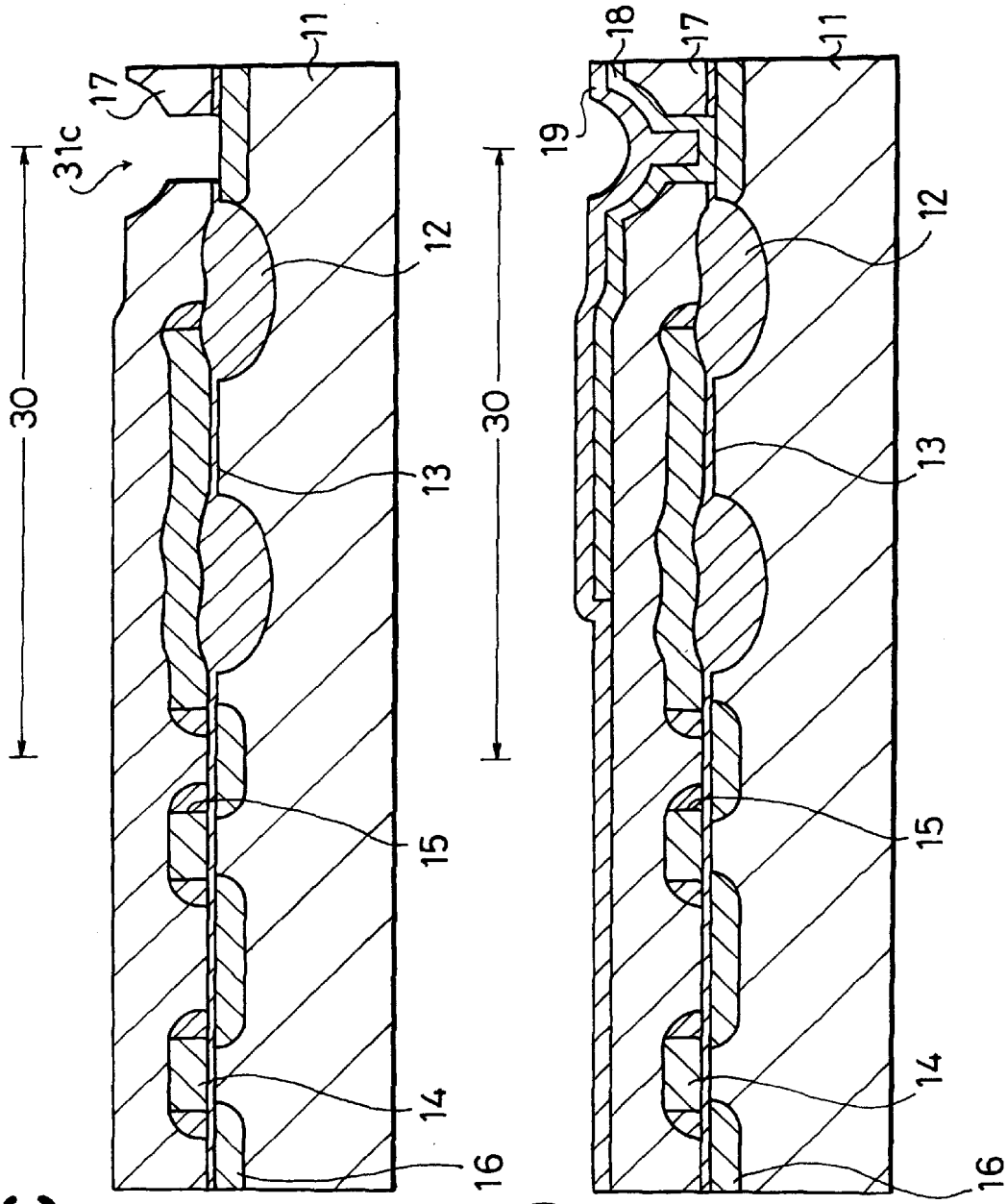

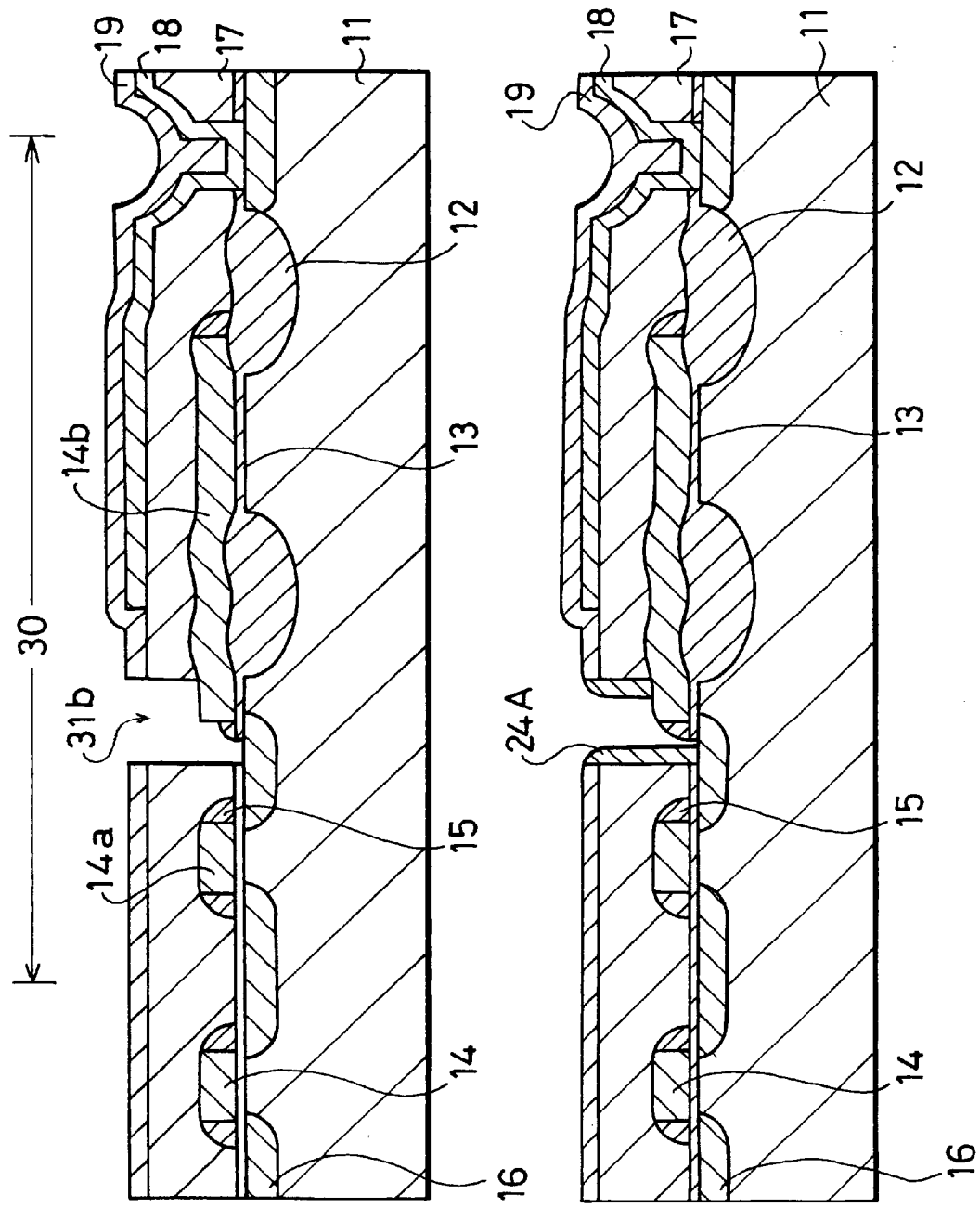

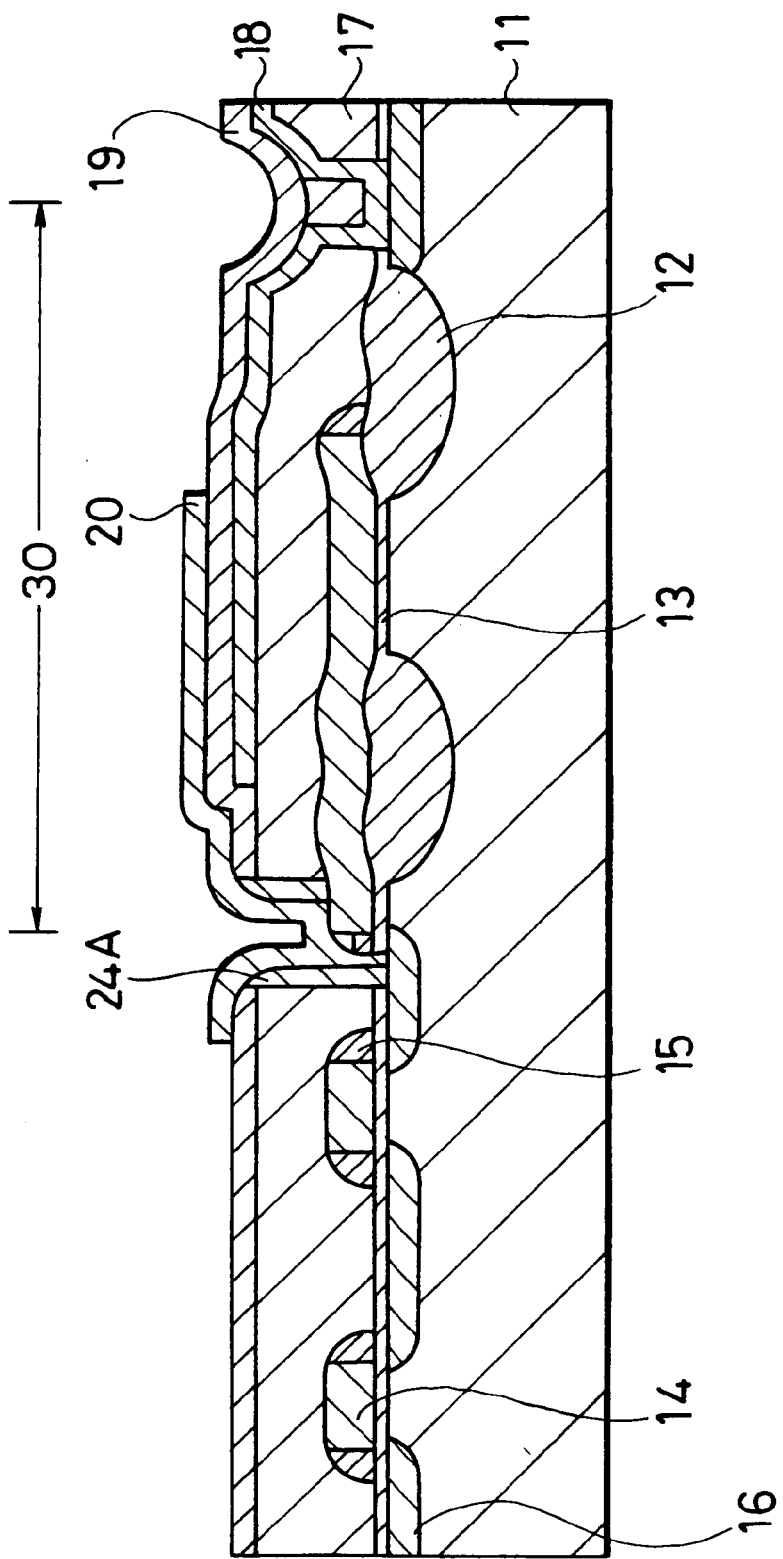

STATIC RAM HAVING A STABLE HIGH-RESISTANCE LOAD

BACKGROUND OF THE INVENTION (a) Field of the Invention

The present invention relates to a static random access memory (static RAM) having a high-resistance load in a memory cell and, in particular, to a technique for achieving a stable resistance for the high-resistance load of a memory cell.

(b) Description of the Related Art

A high-resistance load static RAM comprises a pair of driver transistors, a pair of transfer gate transistors, and a pair of high-resistance loads associated with the pair of driver transistors in each memory cell. The high-resistance load is connected via a through-hole to the gate electrode of the driver transistor and a storage node which is implemented as an extension of the source of the transfer gate transistor. The through-hole generally receives therein a olycrystalline silicon (polysilicon) or semi-insulating polysilicon (SIPOS) film, which is doped with impurities only at the through-hole portion thereof to lower the resistivity of the polysilicon or SIPOS film. Or alternatively, the high-resistance load is connected to the storage node and the gate electrode by a thin undoped polysilicon film.

FIG. 1 shows a conventional static RAM having a thin undoped polysilicon film as mentioned above. A field oxide film 12 separates the surface of a silicon substrate 11 into a plurality of cell areas 30, wherein diffused regions 16a, 16b and 16c are disposed for the cell transistors. Gate electrodes 14a and 14b each having a side-wall oxide film 15 are formed on a gate oxide film 13 formed in the cell area 30. A first interlevel dielectric film 17 covers these transistor elements and has a through-hole 31c for exposing the diffused region 16c, to which a ground line 18 is connected. Further, above these elements is formed a second interlevel dielectric film 19, on which a high-resistance load 20 made of a SIPOS film is disposed.

A through-hole 31b is formed in the first and second interlevel dielectric films 17 and 19 for exposing a portion of the gate electrode 14b of the driver transistor and a storage node 16b formed as an extension of the source of the transfer gate transistor. A low-resistance polysilicon contact film 24E is formed in the through-hole 31b to connect the high-resistance load 20 with the gate electrode 14b of the driver transistor and the storage node 16b.

The low-resistance polysilicon contact film 24E has an extension overlying the high-resistance load 20 in a stacked configuration. A third interlevel dielectric film 21 covers these elements, and a digit line 22 is formed thereon to be connected to the drain of the transfer gate transistor by means of through-hole 31a. A passivation film 23 covers the entire area for protection.

In the conventional static RAM having a high resistivity load as described above, the effective resistive load of the memory cell is determined by the overall resistance of the low-resistance polysilicon contact film 24E and the high-resistance load 20, which fact involves a large variation and an undesirable low resistance in the overall resistance. On the other hand, a larger resistivity, if selected for the polysilicon film 24E to obtain a sufficient larger overall resistance, involves a larger connection resistance between the storage node 16b and the gate electrode 14b of the driver transistor. Namely, a stable effective resistive load and a low connection resistance between the storage node and the gate electrode of the driver transistor are tradeoffs in the memory cell.

Patent Publication JP-A-3-157966 describes another configuration of a memory cell, wherein driver transistors and transfer gate transistors are implemented by a first semiconductor film, a high-resistance load is implemented by a second semiconductor film, and a ground line is implemented by a third semiconductor film.

SUMMARY OF THE INVENTION

It is an object of the present invention to provide a high-resistance load static RAM having excellent characteristics, wherein a stable and accurate effective resistive load can be implemented substantially without raising the connection resistance between the storage node and the gate electrode of the driver transistor.

The present invention provides a static random access memory (RAM) comprising a semiconductor substrate defining a plurality of cell areas, and a memory cell formed in each of the cell areas, the memory cell having a pair of driver transistors each having a pair of diffused regions and a gate electrode, an interlevel dielectric film overlying the driver transistors and having a pair of through-holes each for receiving a contact film, a pair of high-resistance loads overlying the interlevel dielectric film, the contact film having a lower resistivity than the high-resistance loads, each contact film being in direct contact with a corresponding one of the diffused regions and the gate electrode in each through-hole and with an end portion of a corresponding one of the high resistance loads.

In accordance with the static RAM of the present invention, the low resistive contact film connects the diffused region constituting a storage node and the gate of the drive transistor without affecting the resistance of the high-resistance load. Accordingly, a stable and accurate effective resistive load and a low connection resistance can be obtained in a memory cell to achieve an excellent characteristics of the static RAM.

The above and other objects, features and advantages of the present invention will be more apparent from the following description referring to the accompanying drawings.

BRIEF DESCRIPTION OF THE DRAWINGS

FIGS. 3A to 3H are cross-sectional views of the memory cell of FIG. 2 in consecutive steps of fabrication thereof;

PREFERRED EMBODIMENTS OF THE INVENTION

Figure 1:
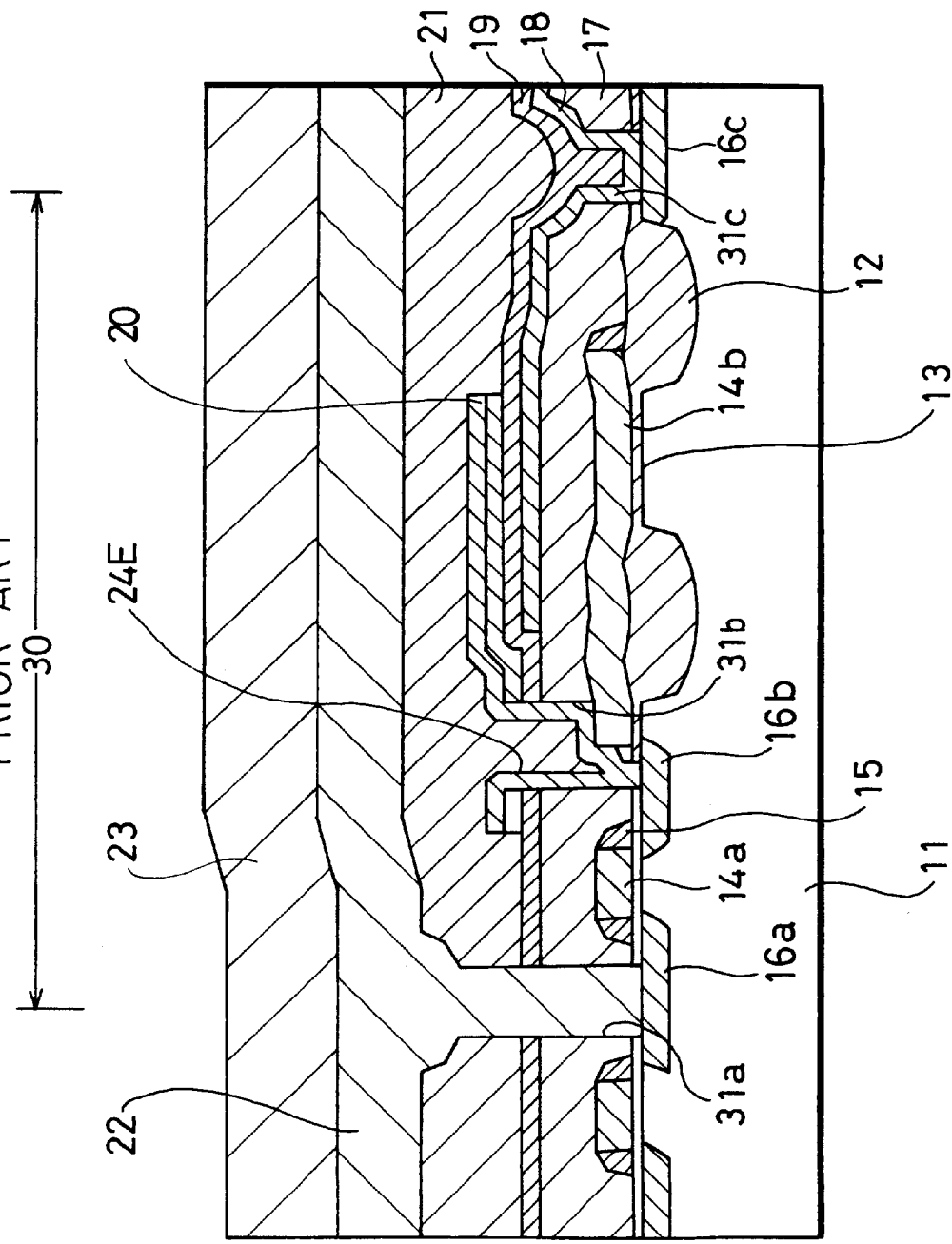
FIG. 1 is a cross-sectional view of a memory cell in a conventional static RAM.

Now, the present invention is more specifically described with reference to the accompanying drawings, wherein similar constituent elements are designated by the same or similar reference numerals throughout the drawings.

Figure 2:
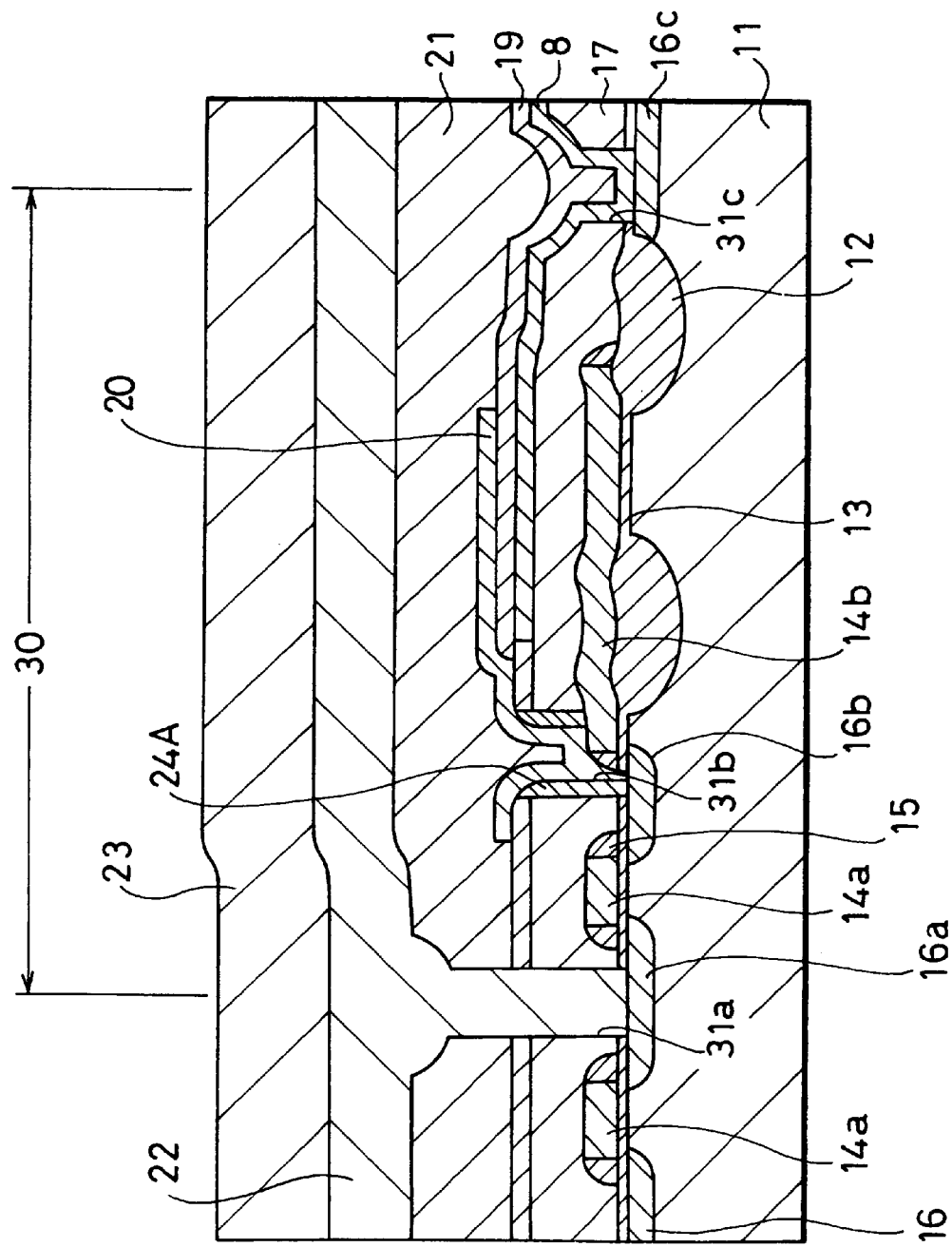
FIG. 2 is a cross-sectional of a memory cell in a static RAM according to a first embodiment of the present invention.

Referring to FIG. 2, a memory cell in a static RAM according to a first embodiment of the present invention comprises a first conductivity (p-type) silicon substrate 11, which is separated by a field oxide film 12, formed on the surface region of the silicon substrate 11, into a plurality of cell areas 30. A memory cell is formed in each cell area 30, and has four cell transistors including a pair of transfer gate transistors and a pair of driver transistors. The cell transistors have second conductivity (n-type) diffused regions 16a and 16c for source/drain regions, a gate oxide film 13 formed on the surface of the silicon substrate 11, gate electrodes 14a and 14b formed on the gate oxide film 13 adjacent to the diffused regions 16a and 16c and having a side-wall film 15 thereon. The source of the transfer gate transistor has an extension 16b which functions as a storage node.

A first interlevel dielectric film (oxide film) 17 covers the gate electrodes 14a and 14b and has therein a through-hole 31b therein for exposing the storage node 16b and a portion of the gate electrode 14b of the driver transistor and a through-hole 31c for exposing the diffused region or source 16c of the driver transistor. A ground line 18 is formed on the first interlevel dielectric film 17 and in the through-hole 31c for the diffused region 16c. A high-resistance load 20 overlies the ground line 18 with an intervention of a second interlevel dielectric film 19 formed therebetween. A third interlevel dielectric film 21, a digit line 22 and a passivation film 23 are consecutively formed thereon.

The inner wall of the through-hole 31b exposing the storage node 16b is covered by a thin cylindrical polycide film 24A having a low resistivity, which connects the storage node 16b and the gate electrode 14b with a low resistance. A lead or end portion of the high-resistance load 20 is formed on the inner wall of the thin cylindrical polycide film 24A in the through-hole 31b.

By employing the above configuration, the storage node 16b and the gate electrode 14b of the driver transistor are connected together with a low resistance substantially without affecting the effective resistive load of the memory cell, thereby achieving a low variation in the effective resistive load.

In the above embodiment, it is preferable that SIPOS or undoped polysilicon be used for the material of the high-resistance load 20, whereas doped polysilicon, such as P-doped polysilicon (DOPOS), diffused polysilicon, tungstensilicide(WSi) or tungsten (W) be used for the material of the thin polycide film 24A.

Figure 3H:
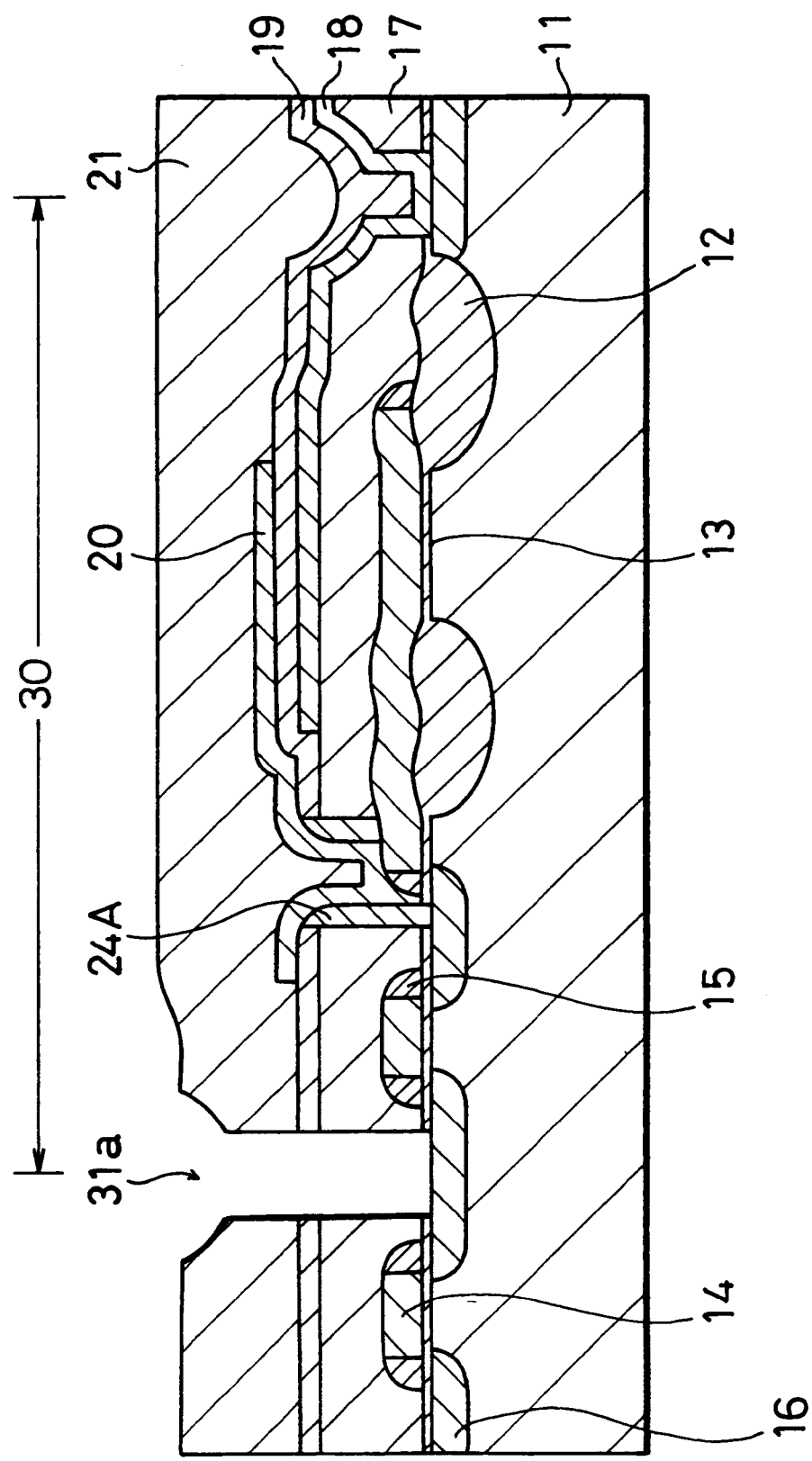

Referring to FIGS. 3A to 3H, a method for manufacturing the static RAM of FIG. 2 will be described. In FIG. 3A, a field oxide film 12 having a thickness of about 300 nm is formed on a p-type silicon substrate 11, doped with impurities at a dosage of about $1 \times 10^{15}$ cm$^{-3}$, for isolation of cell areas, followed by formation of a 8 nm-thick gate oxide film 13 on a portion of the silicon substrate other than the field oxide film 12.

Subsequently, as shown in FIG. 3B, gate electrodes 14a and 14b are formed on the gate oxide film 13 by a known process, followed by formation of side-wall films 15 on the side walls of the gate electrodes 14a and 14b and formation of doped regions 16a, 16b and 16c by a self-alignment process to form four cell transistors in each cell area 30.

Subsequently, as shown in FIG. 3C, a BPSG (Borophosphosilicate glass) (or first interlayer dielectric) film 17 is deposited to a thickness of 300 nm, for example, on the entire surface, followed by a selective etching to form a through-hole 31c therein for exposing the diffused region 16c. Thereafter, as shown in FIG. 3D, a ground line 18 is formed by a known technology on the first interlevel dielectric film 17 and in the through-hole 31c to be connected to the diffused region 16c, followed by growth of a 100 nm-thick oxide film 19 constituting a second interlevel dielectric film.

Subsequently, as shown in FIG. 3E, the first and the second interlevel dielectric films 17 and 19 and the gate oxide film 13 are subjected to a selective etching to form a common through-hole 31b for exposing together the storage node 16b and a portion of the gate electrode 14b of the driver transistor.

Subsequently, as shown in FIG. 3F, a 100 nm-thick polysilicon film doped with phosphorous (P) is grown on the entire surface including the through-hole 31b, followed by etch-back thereof, thereby forming a cylindrical polycide contact film 24A covering the inner wall of the common through-hole 31b and having a bottom in direct contact with the diffused region 16b and the portion of the gate electrode 15b of the driver transistor. As a result, the cylindrical polycide contact film 24A connects the storage node 16b with the gate electrode 15b of the driver transistor.

Subsequently, as shown in FIG. 3G, a 80 nm-thick SIPOS film is grown on the entire surface, followed by patterning thereof to form a high-resistance load film 20, which has an extension disposed in the through-hole in direct contact with the inner wall of the cylindrical contact film 24A. Thereafter, as shown in FIG. 3H, a 400 nm-thick BPSG film 21 is formed as a third interlevel dielectric film, followed by a selective etching thereof and of the underlying layers 17 and 19 to form a through-hole 31a exposing the drain 16a of the transfer transistor. Then, as shown in FIG. 2, a digit line 22 is formed on the BPSG film 21 and in the through-hole 31a to be connected to the drain 16a of the transistor. Thereafter, a 800 nm-thick passivation layer 23 made of SiON is grown on the entire surface to obtain the final structure of FIG. 2.

In the memory cell of FIG. 2, it will be understood that the high-resistance load 20 is formed of SIPOS film, which has a stable resistance, without raising the connection resistance between the storage node 16 and the gate electrode 14b of the driver transistor.

Figure 4:
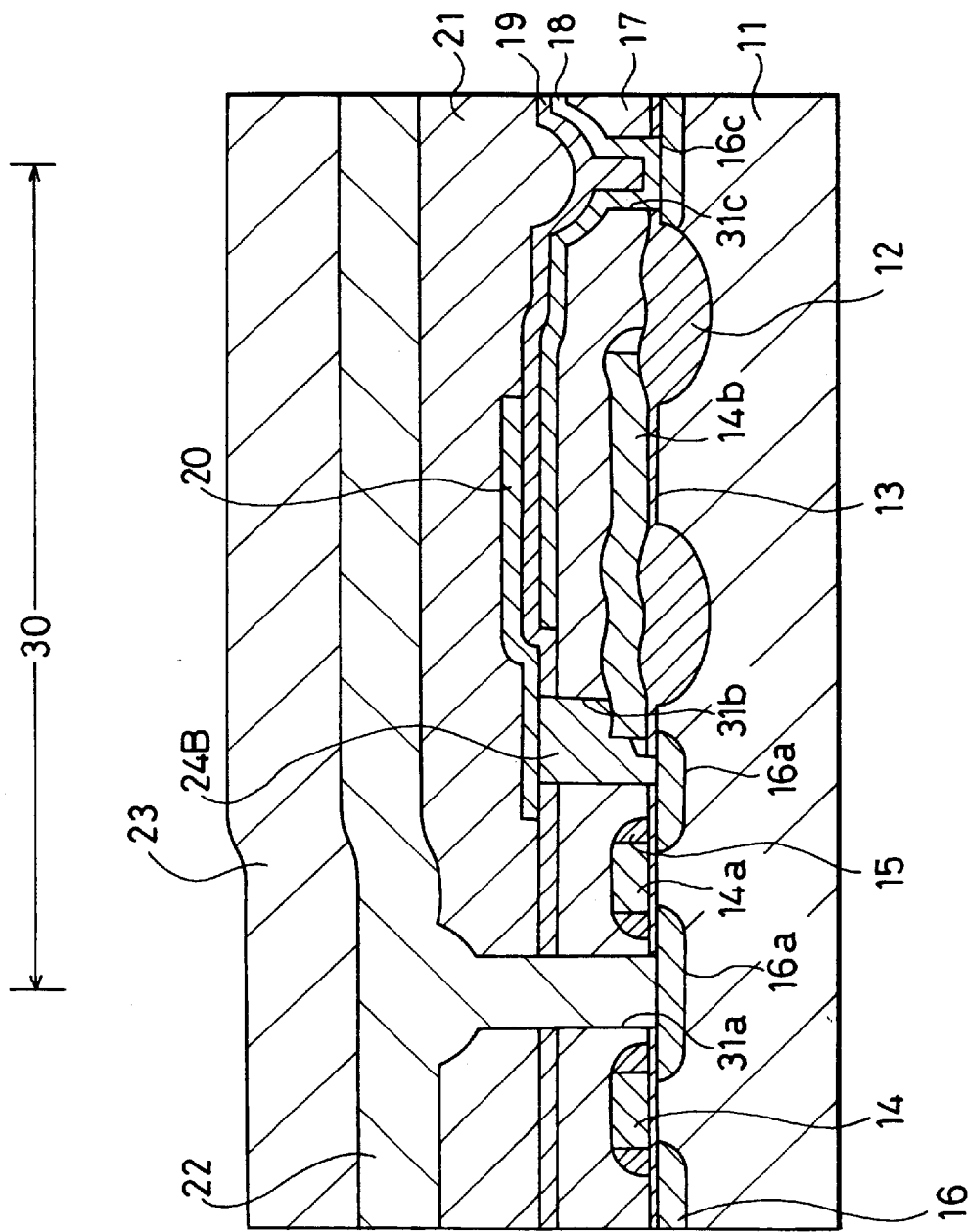
FIG. 4 is a cross-sectional view of a memory cell in a static RAM according to a second embodiment of the present invention.

Referring to FIG. 4, a memory cell in a static RAM according to a second embodiment of the present invention is similar to the first embodiment except that the storage node 16b and the gate electrode 14b of the driver transistor are connected together by a contact plug 24B made of polysilicon filled in the through-hole 31b, and that the high-resistance load 20 is disposed in direct contact with the top of he contact plug 24B. In this structure, a more stable connection resistance can be obtained between the high-resistance load 20 and the contact plug 24B.

Figure 5:
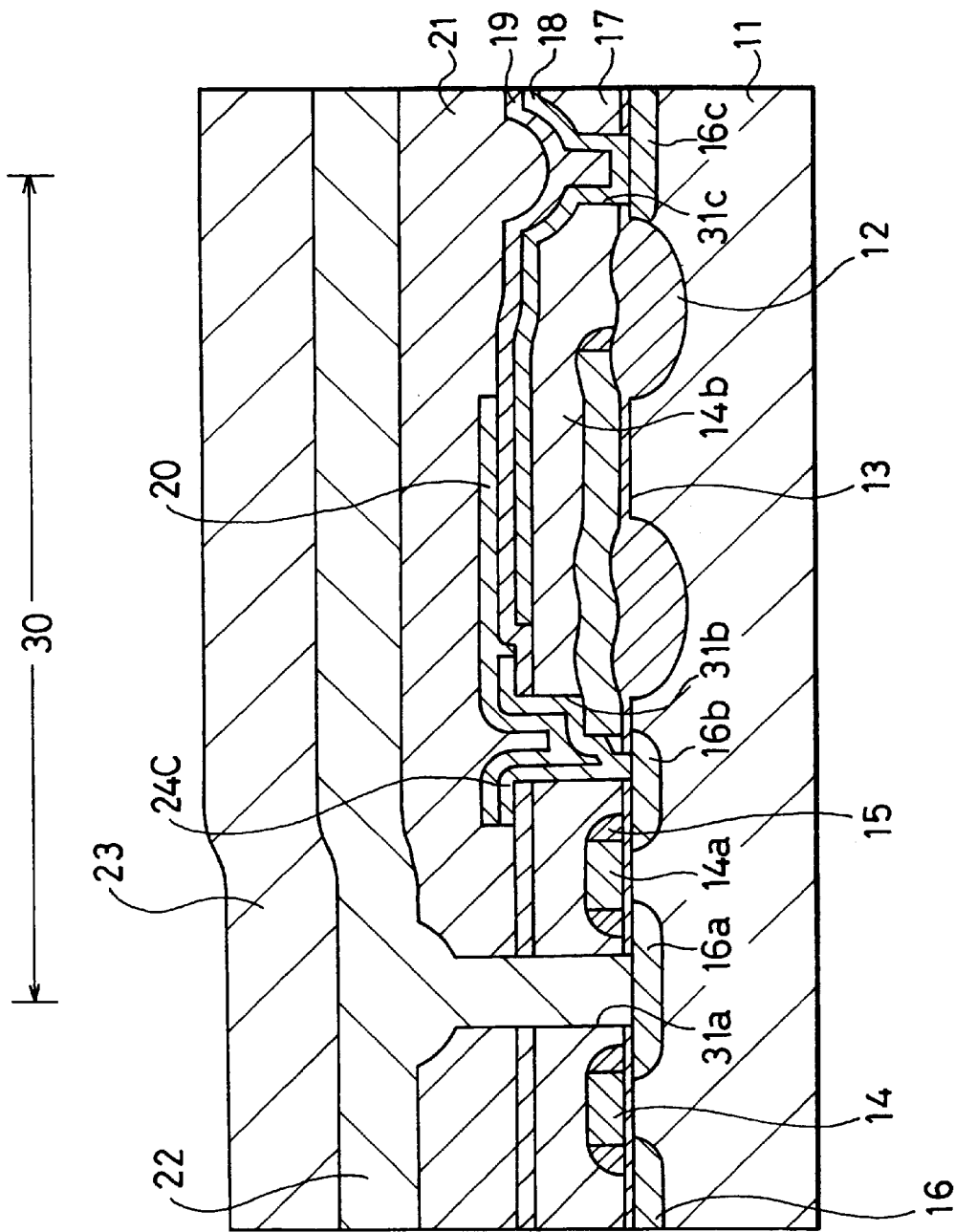
FIG. 5 is a cross-sectional view of a memory cell in a static RAM according to a third embodiment of the present invention.

Referring to FIG. 5, a memory cell in a static RAM according to a third embodiment of the present embodiment is similar to the first embodiment except that the storage node 16b and the gate electrode 14b of the driver transistor are connected by a polysilicon pad film 24C which extends from the inner wall of the through-hole 31b to the top of the first interlevel dielectric film 17, on which a portion of the high-resistance load 20 is disposed. A larger contact area can be obtained in the present embodiment between the polysilicon pad film 24C and the high-resistance load 20.

Figure 6:
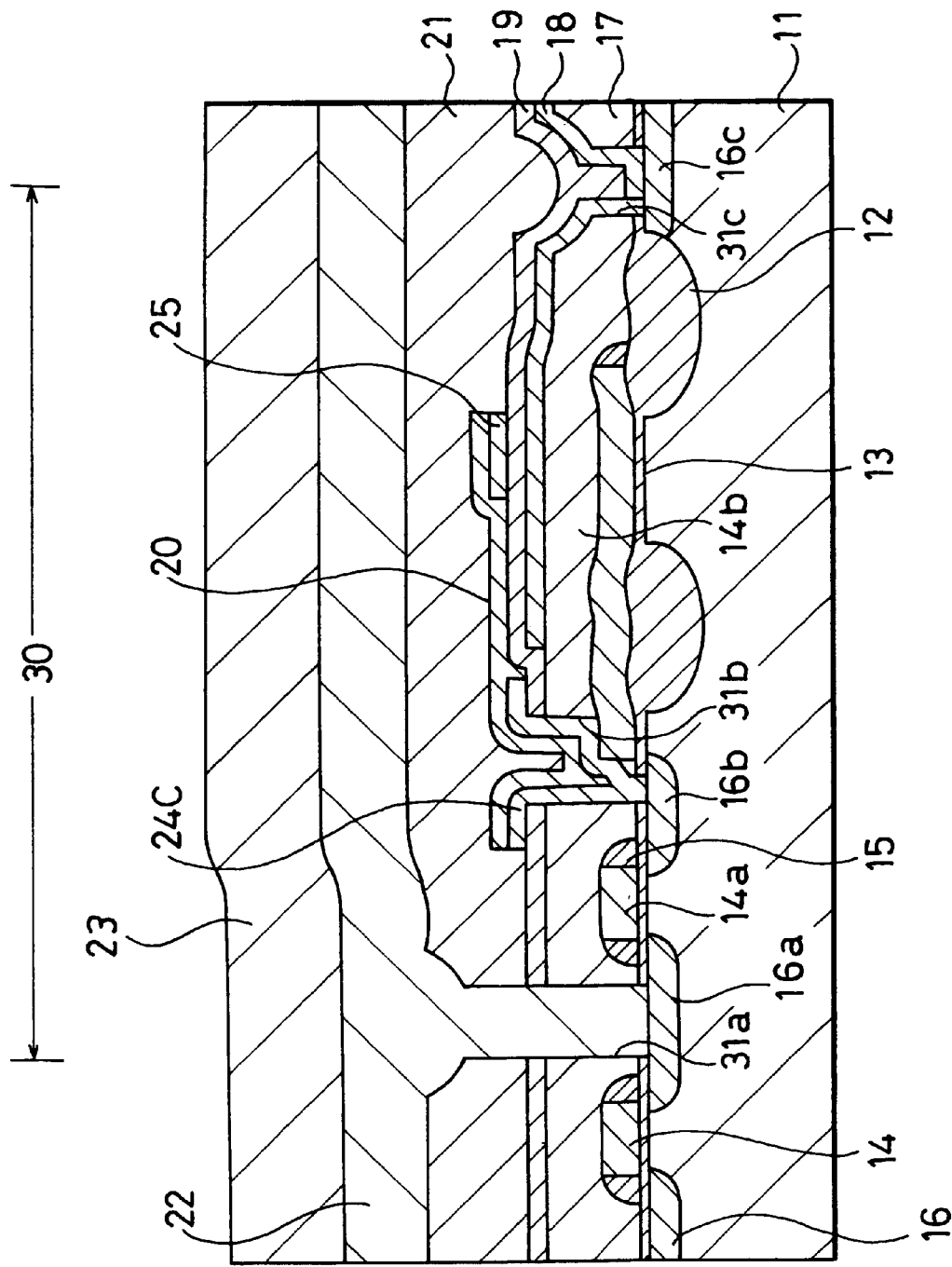
FIG. 6 is a cross-sectional view of a memory cell in a static RAM according to a fourth embodiment of the present invention.

Referring to FIG. 6, a memory cell in a static RAM according to a fourth embodiment of the present embodiment is similar to the third embodiment except for a low resistive source line (Vcc) 25 which is formed as a common layer with the polysilicon pad film 24C. In this structure, the length and the resistance of the high-resistance load 20 are determined by the contact with the polysilicon pad film 24C and the contact with the source line 25, which fact provides a low variation and a stable value in the resistance of the high-resistance load 20.

Figure 7:
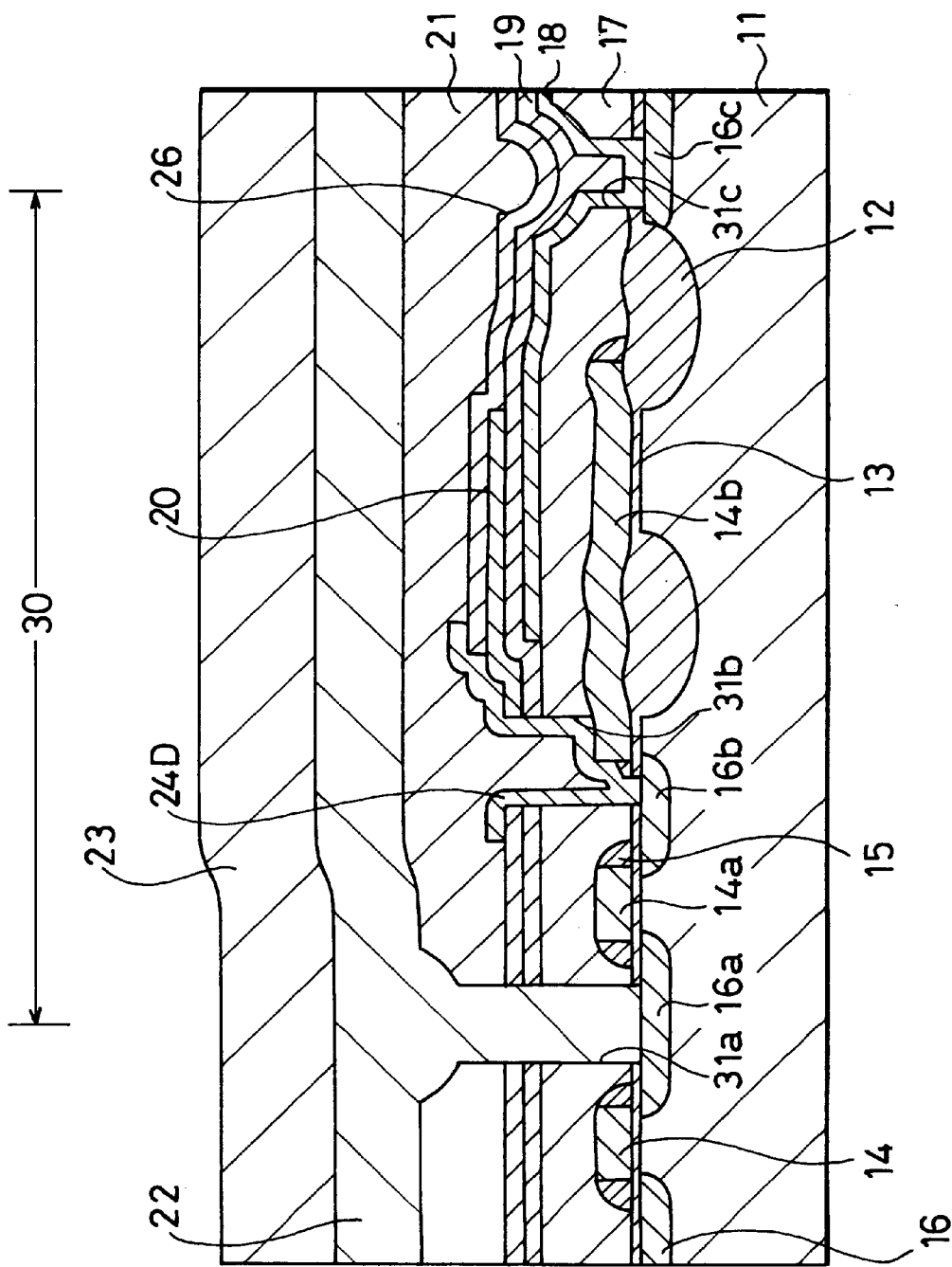
FIG. 7 is a cross-sectional view of a memory cell in a static RAM according to a fifth embodiment of the present invention.

Referring to FIG. 7, a memory cell in a static RAM according to a fifth embodiment of the present embodiment is similar to the third embodiment except that the through-hole 31b for receiving a polysilicon pad film 24D is formed in the present embodiment after the high-resistance load 20 is patterned and the overlying second interlevel dielectric film 19 is formed. The polysilicon pad film 24D is formed as overlying the storage node 16b, the gate electrode 14b of the driver transistor and the high-resistance load 20.

Figure 8:
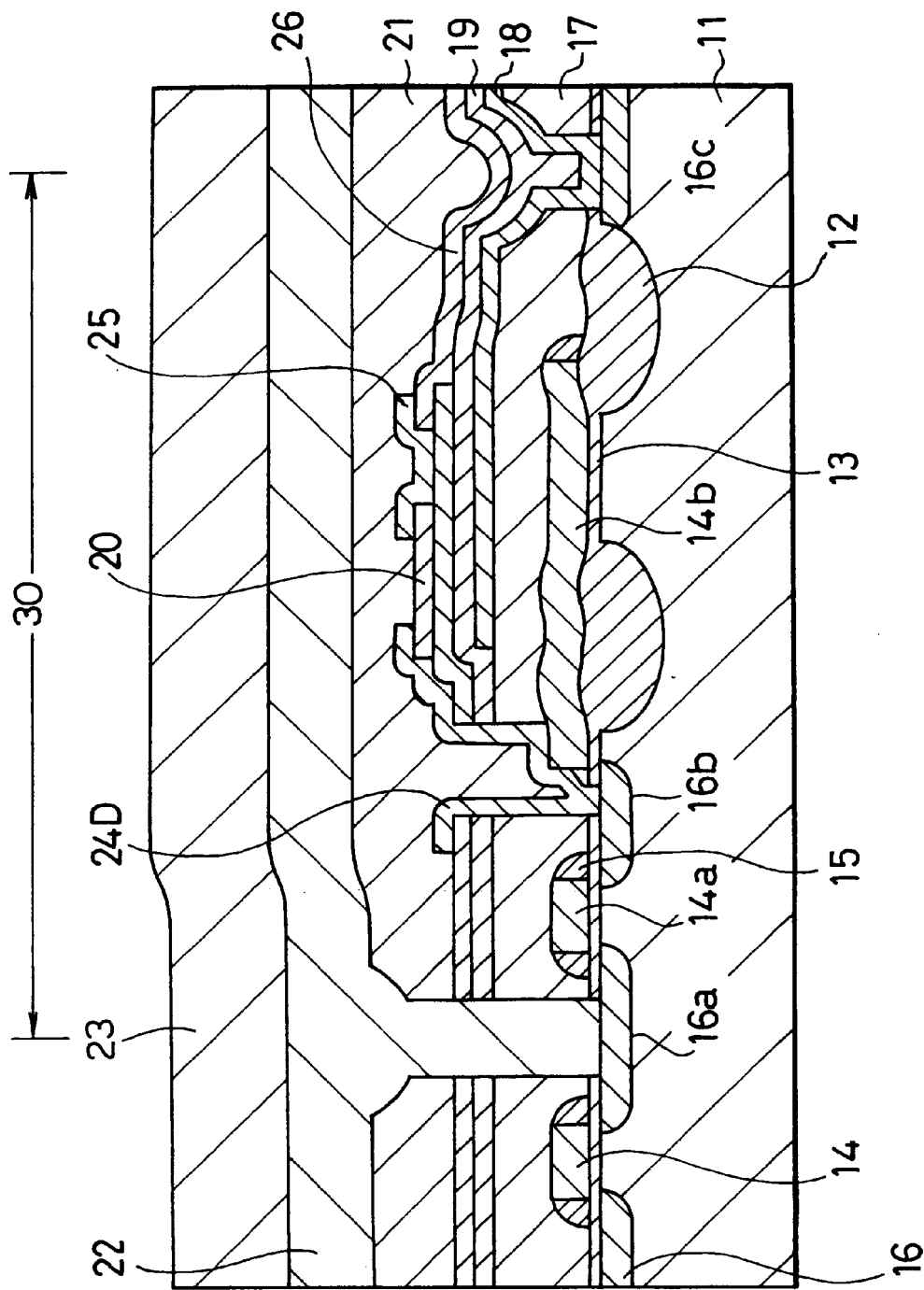
FIG. 8 is a cross-sectional view of a memory cell in a static RAM according to a sixth embodiment of the present invention.

Referring to FIG. 8, a memory cell in a static RAM according to a sixth embodiment of the present embodiment is similar to the fifth embodiment except that a source line 25 is formed as a common layer with the polysilicon pad film 24D. The present embodiment achieves an advantage similar to that of the fourth embodiment.

Figure 9:
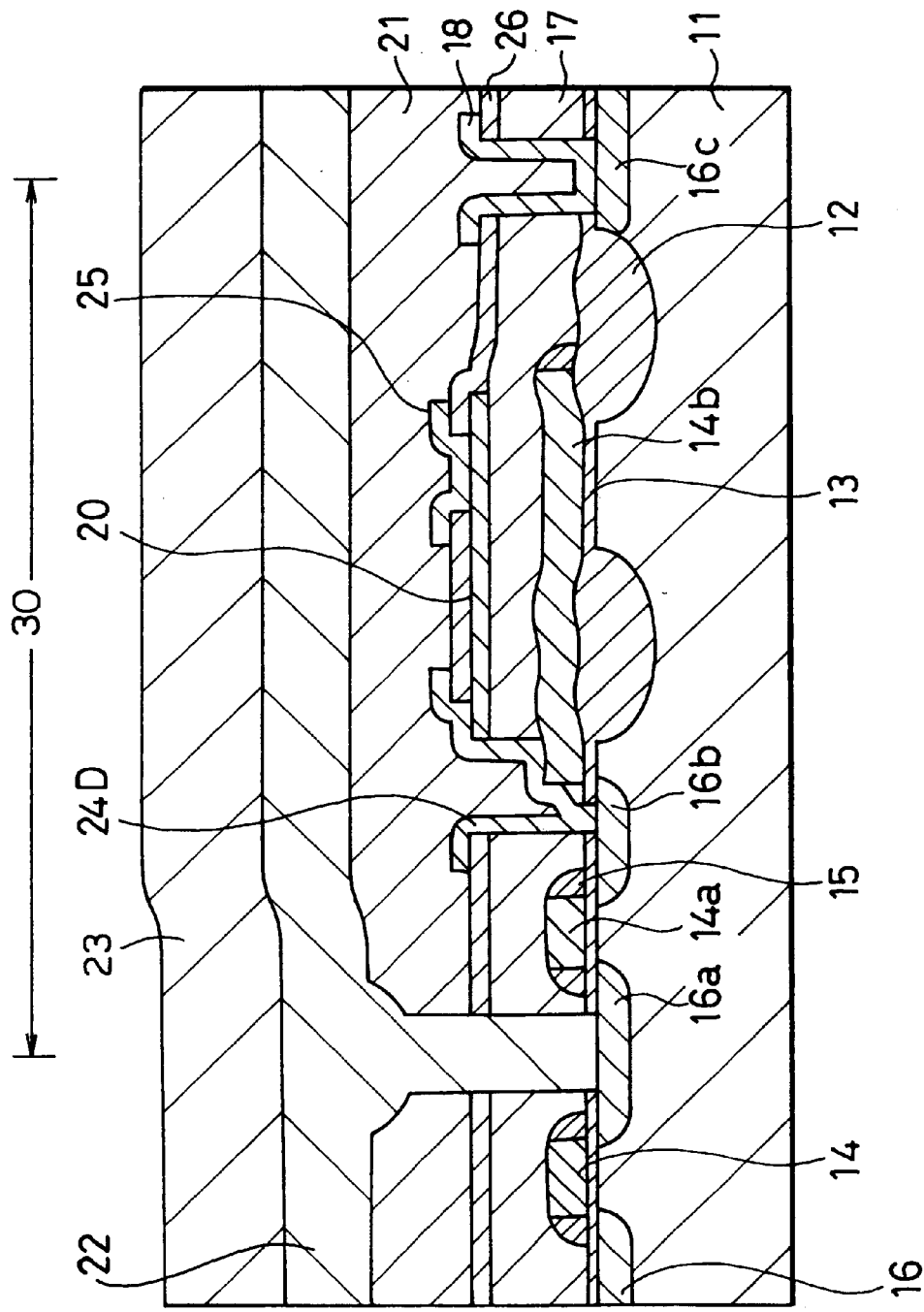
FIG. 9 is a cross-sectional view of a memory cell in a static RAM according to a seventh embodiment of the present invention.

Referring to FIG. 9, a memory cell in a static RAM according to a seventh embodiment of the present embodiment is similar to the sixth embodiment except that the ground line 18 is formed as a common layer with the polysilicon pad film 24D and the source line 25. In this configuration, the number of fabrication steps can be reduced.

Since the above embodiments are described only for examples, the present invention is not limited to the above embodiments and various modifications or alterations can be easily made therefrom by those skilled in the art without departing from the scope of the present invention.

What is claimed is:

1. A static random access memory (RAM) comprising a semiconductor substrate defining a plurality of cell areas, and a memory cell formed in each of said cell areas, said memory cell having a pair of driver transistors each having a pair of diffused regions and a gate electrode, an interlevel dielectric film overlying said driver transistors and having a through-hole for receiving a substantially cylindrical contact film, a high-resistance load overlying said interlevel dielectric film, said contact film having a lower resistivity than said high-resistance load, said contact film being in direct contact with a corresponding one of said diffused regions and said gate electrode in said through-hole, said high resistance load extending through said through-hole into contact with said one of said diffused regions and said gate electrode.

2. A static PAM as defined in claim 1, wherein said contact film has an inner cylindrical wall in direct contact with said high-resistance load.

3. A static RAM as defined in claim 2, further comprising a source line and/or a ground line formed as a common layer with said contact film.

4. A static RAM as defined in claim 1, wherein said high-resistance load is made of semi-insulating polycrystalline silicon (polysilicon) or undoped polysilicon.

5. A static RAM as defined in claim 4, wherein said contact film is made of doped or diffused polysilicon.

6. A static RAM as defined in claim 4, wherein said contact film is made of phosphorous doped polysilicon.

7. A static RAM as defined in claim 4, wherein said contact film is made of tungsten or tungsten silicide.

8. A static RAM as defined in claim 1, wherein said one of said diffused regions constitutes a storage node of said memory cell.

* * * * *